(12) United States Patent
Jha (10) Patent No.: US 10,020,824 B1
(45) Date of Patent: Jul. 10, 2018

(54) METHOD AND SYSTEM FOR EFFICIENT BLOCK SYNCHRONIZATION SCHEME ON A SCRAMBLED CYCLIC CODE BIT STREAM

(71) Applicant: Cadence Design Systems, Inc., San Jose, CA (US)

(72) Inventor: Sarath Kumar Jha, Uttar Pradesh (IN)

(73) Assignee: Cadence Design Systems, Inc., San Jose, CA (US)

( * ) Notice: Subject to any disclaimer, the term of this patent is extended or adjusted under 35 U.S.C. 154(b) by 11 days.

(21) Appl. No.: 15/185,828

(22) Filed: Jun. 17, 2016

(51) Int. Cl.
*H03M 13/33* (2006.01)
*H03M 13/09* (2006.01)
*H03M 13/00* (2006.01)

(52) U.S. Cl.
CPC ......... *H03M 13/333* (2013.01); *H03M 13/09* (2013.01); *H03M 13/611* (2013.01); *H03M 13/6527* (2013.01)

(58) Field of Classification Search
CPC ............................. H03M 13/333; H03M 13/09
See application file for complete search history.

(56) References Cited

U.S. PATENT DOCUMENTS

| | | | | |
|---|---|---|---|---|
| 4,253,114 A * | 2/1981 | Tang | ...................... | H04N 7/162 348/E7.06 |
| 5,974,584 A * | 10/1999 | Hendrickson | ........... | H03L 7/107 714/703 |
| 6,158,039 A * | 12/2000 | Cho | .................... | G11B 20/1813 369/47.17 |
| 6,470,473 B1 * | 10/2002 | Iwasa | ................. | G11B 20/1803 714/785 |
| 6,983,414 B1 * | 1/2006 | Duschatko | .......... | H03M 13/015 714/776 |
| 7,003,715 B1 * | 2/2006 | Thurston | ................. | G06F 7/724 714/782 |
| 7,447,982 B1 * | 11/2008 | Thurston | ............... | H03M 13/27 714/781 |
| 2002/0133779 A1 * | 9/2002 | Shieh | ............... | G11B 20/10527 714/755 |
| 2003/0131310 A1 * | 7/2003 | Pitio | ................... | G06F 11/1008 714/800 |
| 2003/0179783 A1 * | 9/2003 | Uekama | ................. | H04J 3/1611 370/535 |
| 2008/0201627 A1 * | 8/2008 | Yamasuge | ......... | H03M 13/2936 714/784 |

(Continued)

Primary Examiner — Joseph D Torres
(74) Attorney, Agent, or Firm — Vista IP Law Group, LLP (57) ABSTRACT

An improved approach is provided to identifying the boundary of data encoded using additive cyclic codes. In some embodiment, the process includes determining a first calculated parity of a first bit stream window, and, second, one or more updates to the calculated parity of the bit stream window to determine the parity of the next bit stream window, where after each update to the calculated parity, the calculated parity is compared with the target parity, and matching the calculated parity to the target parity indicates a proper boundary of a bit stream window. In some embodiments, the process supports shortened cyclic codes. In some embodiments, the bit stream boundary can be identified prior to descrambling the bit stream inputs for a given bit stream window. In this way, the process can avoid unnecessarily descrambling of the bit stream windows that are not properly aligned to a bit stream boundary.

18 Claims, 9 Drawing Sheets

(56) References Cited

U.S. PATENT DOCUMENTS

2009/0228977 A1* 9/2009 Lee .................. H04L 9/3226
  726/18
2010/0205515 A1* 8/2010 Yang ................ H03M 13/2906
  714/800

* cited by examiner

METHOD AND SYSTEM FOR EFFICIENT BLOCK SYNCHRONIZATION SCHEME ON A SCRAMBLED CYCLIC CODE BIT STREAM

FIELD

This disclosure relates to the field of scrambled cyclic code bit streams.

BACKGROUND

Modern electronics exchange vast amounts of information using various communications protocols and techniques. Bit streams are one such technique used for transferring data serially from a transmitter to a receiver in many different applications. For instance, wired networks such as 802.3, commonly referred to as Ethernet, utilize serial data transfer techniques to exchange packetized information. Cable companies use similar techniques to transmit video and audio data to their customers. Furthermore, wireless communications protocols, such as 802.11, commonly referred to as Wi-Fi, operate similarly but use radio waves to transmit data instead of using wires. Likewise, cellular devices use various encoding schemes to transmit serial data over the air to cellular devices from cellular towers and antennas. Furthermore, within many consumer devices, bit streams are used to serially transfer data. For example, many storage devices use the Serial Advanced Technology Attachment (SATA) protocol to exchange information, and many peripheral devices use the Universal Serial Bus (USB) to interface with everything from pointing devices to drives.

Scrambling of data serves two purposes. First, scrambling operates at the cyclic code word boundary for establishing block synchronization. Second, scrambling is used to ensure that an appropriate DC balance is maintained. Scramble techniques include additive scrambling and multiplicative scrambling, both of which can be mathematically represented by polynomials and are generally implemented using linear feedback shift registers (LFSRs). However, scrambling data necessitates additional computations in order to descramble the data.

Present descrambling techniques operate using brute force methods. Specifically, each individual bit stream window is independently analyzed to determine if it is a proper bit stream boundary. However, independently evaluating each and every window of the bit stream is inefficient computationally intensive. Therefore, there is a need for an improved approach to descrambling bit stream data.

SUMMARY

Embodiments of the invention provide an improved method, apparatus, and computer program product for identifying the bit stream boundary for data encoded using additive cyclic codes such as fire code.

Further details of aspects, objects, and advantages of the invention are described below in the detailed description, drawings, and claims. Both the foregoing general description and the following detailed description are example and explanatory, and are not intended to be limiting as to the scope of the invention.

BRIEF DESCRIPTION OF THE DRAWINGS

In order that the present invention is better understood, some embodiments of the invention will now be described, by way of example only, with reference to the accompanying drawings.

DETAILED DESCRIPTION

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Embodiments of the invention provide an improved method, apparatus, and computer program product for identifying the bit stream boundary for data encoded using additive cyclic codes. In contrast to prior techniques, the present application discloses an iterative method of identifying the bit stream boundary instead of independently computing each bit stream window to determine whether the bit stream boundary is a proper boundary. The process includes, first, determining a first calculated parity of a first bit stream window and identifying if the first bit stream window's calculated parity is a match to the target parity (corresponding to a scrambling polynomial), and, second, one or more updates to the calculated parity of the bit stream window to determine the parity of the next bit stream window, where after each update to the calculated parity the calculated parity is compared with the target parity, and matching the calculated parity to the target parity indicates a proper boundary of a bit stream window.

In some embodiments, the process includes support for calculating the parity of shortened cyclic code bit stream windows, and include processes, methods, or apparatus that may support both regular and shortened cyclic.

In some embodiments, a first initial parity is calculated for a first bit stream window and compared to a target parity. If the first initial parity of the first bit stream window is equal to the target parity, then the bit stream window corresponds to a proper bit stream window boundary. However, if the calculated parity is not equal to the target parity then the bit stream window does not correspond to a proper bit stream window boundary.

When the initial parity calculated for the first bit stream window is not equal to the target parity, the calculated parity can be updated in three steps if the scrambling code is an additive cyclic code. First, a shift operation can be performed on the calculated parity where the shift operation includes inputting a zero in the last position, while performing a bitwise XOR operation as determined by the values of the coefficients of the polynomial representing the additive cyclic code with the last value of the calculated parity. Second, the last value of the calculated parity should be replaced with the value of the calculated parity XOR'd with the value of the first bit of the previous bit stream window. Finally, the last value should be replaced with the last value XOR'd with the last bit of the new bit stream window. Here, the last value of the calculated parity corresponds to the last value added to the parity calculation, which generally corresponds to the least significant bit.

If the updated calculated parity of the new bit stream window is equal to the target parity, then the new bit stream window corresponds to a proper bit stream window boundary. However, if the calculated parity is not equal to the target parity then the bit stream window does not correspond to a proper bit stream window boundary, and additional updates must be performed until the proper bit stream window is identified.

In some embodiments, the process may also support determining the parity of shortened cyclic codes, using a similar process, and a calculated parity offset when the next bit stream input is equal to 1.

Furthermore, the disclosure provides a process by which the bit stream boundary can be identified prior to descrambling the bit stream inputs for a given bit stream window. In this way, the process can avoid unnecessarily descrambling of the bit stream windows that are not properly aligned to a bit stream boundary and thereby improve the efficiency of the operation of a computing device.

Figure 1:
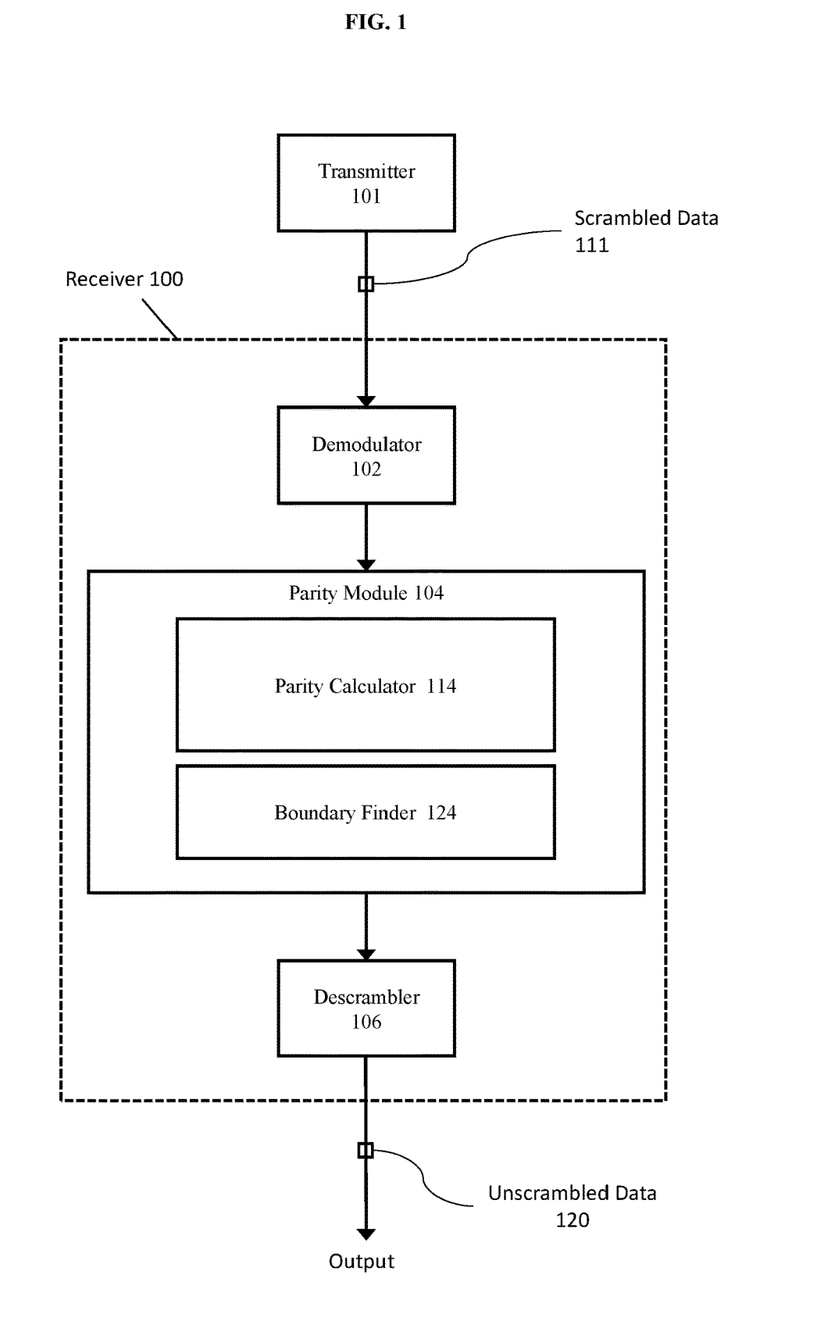
FIG. 1 illustrates an example receiver which may be employed in some embodiments of the invention to implement boundary identification of bit streams that are scrambled using cyclic codes.

FIG. 1 illustrates an example receiver 100 which may be employed in some embodiments of the invention to implement boundary identification of bit streams that are scrambled using cyclic codes. Receiver 100 provides one possible use case for the disclosed matter, though others are possible, and could include implementations of other modules to support data scrambled using other techniques such as multiplicative scrambling methods.

Receiver 100 includes a demodulator 102, a parity module 104, and a descrambler 106. The illustrated implementation includes a demodulator as is used in many wireless applications such as cellular data transmission and Wi-Fi. However, the receiver 100 could be modified to support other transmission mediums such as 802.3. The receiver 100 is configured to receive at least scrambled data 111 from transmitter 101 and outputs unscrambled data at 120.

The transmitter 101 could include wired or wireless transmission devices, such as devices that transmit cellular data like cell phones or cellular towers, or WiFi devices and the like. In the alternative such devices might include wired devices such as routers, modems, computers, cable boxes, and the like. Transmitter 101 may comprise only a small portion of the device itself, and may transmit both scrambled and unscrambled data. The transmitter 101 may also receive data from one or more sources that are either part of the device or external to it. However, as illustrated the transmitter outputs at least some scrabbled data 111.

The demodulator 102 receives at least scrambled data 111 from a transmitter such as transmitter 101. The scramble data 111 could originate from any serial input stream such as a wireless data input stream. The demodulator would then, as is known in the art, recover the signals received either wirelessly or via a wired connection and convert them into a format which can be further processed and analyzed. However, other input streams and circuits could be used either separately or in addition to the demodulator 102 to convert incoming data into an appropriate format.

The parity module 104 is electrically coupled to the demodulator 102 and the descrambler 106. Particular implementations of the parity module 104 will be discussed further in regard to FIGS. 2, 5, and 8. However, the disclosed process could be performed using software or hardware or some combination thereof. The parity module 104 computes the parity of the output of the demodulator or other circuit performing a similar function. The parity module as illustrated here includes a parity calculator 114 that determines a parity for a particular set of input bits, and a boundary finder 124 that determines whether the particular set of input bits correspond to a proper bit stream window by determining if the parity module 104 has calculated a parity that is the same as the target parity. If the calculated parity and the target parity are the same then the parity module 104 can either output the received input bits from the demodulator 102 or trigger the descrambler 106 to read or received them from another source such as a buffer.

The parity circuit module 104 operates on, at least, scrambled bit streams which can be represented using polynomials. Using some math it can be found that the bit stream does not need to be descrambled before the parity is computed to identify the proper bit stream window boundary when additive cyclic codes are used. Instead, the code boundary can be detected by matching the parity of a bit stream with the parity of the scrambled sequence.

First let, $$r(x)=c(x)+s(x) \qquad \text{(eq. 1)}$$

where
r(x): is a received word,
c(x): is a code word,
s(x): is the scrambled sequence.
Then if g(x) is the generator polynomial of the cyclic code, and if $$c(x) \bmod g(x)=0 \qquad \text{(eq. 2)}$$

Then c(x) is a valid code word. Otherwise, if equation 2 is not equal to 0 then c(x) is not a valid code word. When c(x) is a valid code word, then for some a(x)

$$c(x)=a(x)*g(x) \qquad \text{(eq. 3)}$$

Then the remainder is taken with respect to g(x) where r(x) is the remainder:

$$r(x) \bmod g(x)=c(x) \bmod g(x)+s(x) \bmod g(x) \qquad \text{(eq. 4)}$$

which equals s(x) mod g(x) because c(x) mod g(x)=0.

Thus the parity of a valid code word after scrambling is the same as the parity of the scrambled sequence itself, the code word boundary can be detected by matching the target parity with the parity of the scrambled sequence, without descrambling the scrambled sequence before the parity is computed to identify the proper bit stream window boundary.

The descrambler 106 is electrically coupled to the parity module 104 to receive outputs from the parity module 104 and outputs unscrambled data at 120. The descrambler 106 is used to descramble the data received from the parity module 104. However, instead of descrambling each bit stream window, the descrambler is only required to descramble bit stream windows that are properly aligned to the bit stream boundary. This is because the parity module 104 can be used to identify the bit stream boundary without requiring that the bit stream be descrambled beforehand. Furthermore, while the descrambler 106 is illustrated as receiving inputs only from parity module 104, as one of ordinary skill would understand, different embodiments could be provided. For instance, the descrambler could receive a control signal from the parity circuit indicating when a shared buffer includes bit stream data that is properly aligned to a bit stream window and ready for descrambling.

Figure 2:
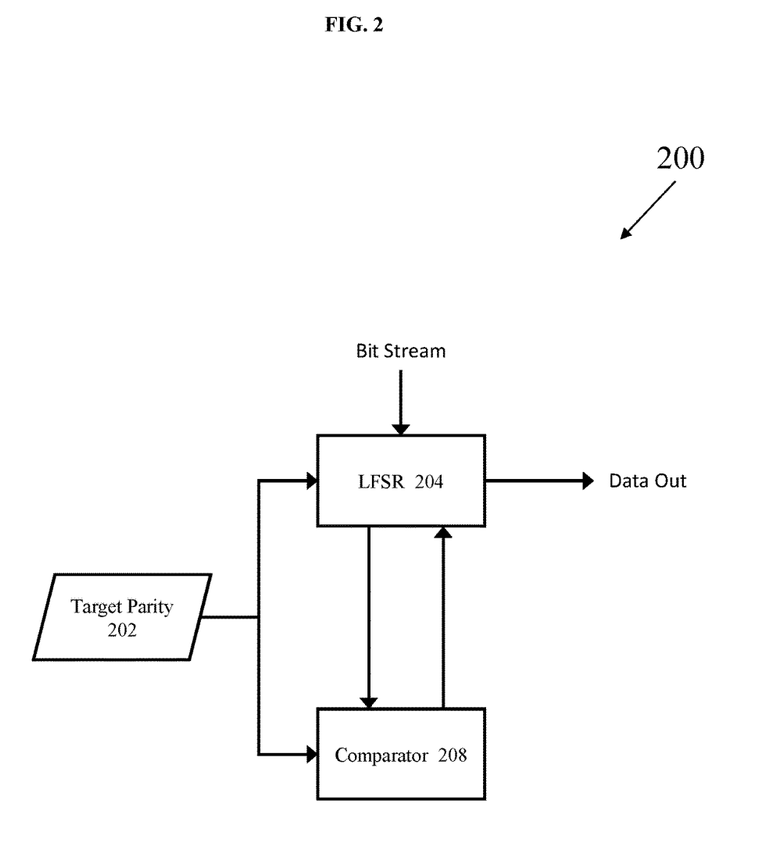
FIG. 2 illustrates an apparatus according to some embodiments of the invention.

FIG. 2 illustrates an apparatus 200 according to some embodiments of the invention. FIG. 2 includes a linear-feedback shift register (LFSR) 204 and a comparator 208, both of which are electrically coupled to a storage element that stores a target parity 202 (corresponding to a scrambling polynomial). FIG. 2 is a high level diagram included solely as a possible implementation of a circuit which implements aspects of the disclosure here.

Figure 5:
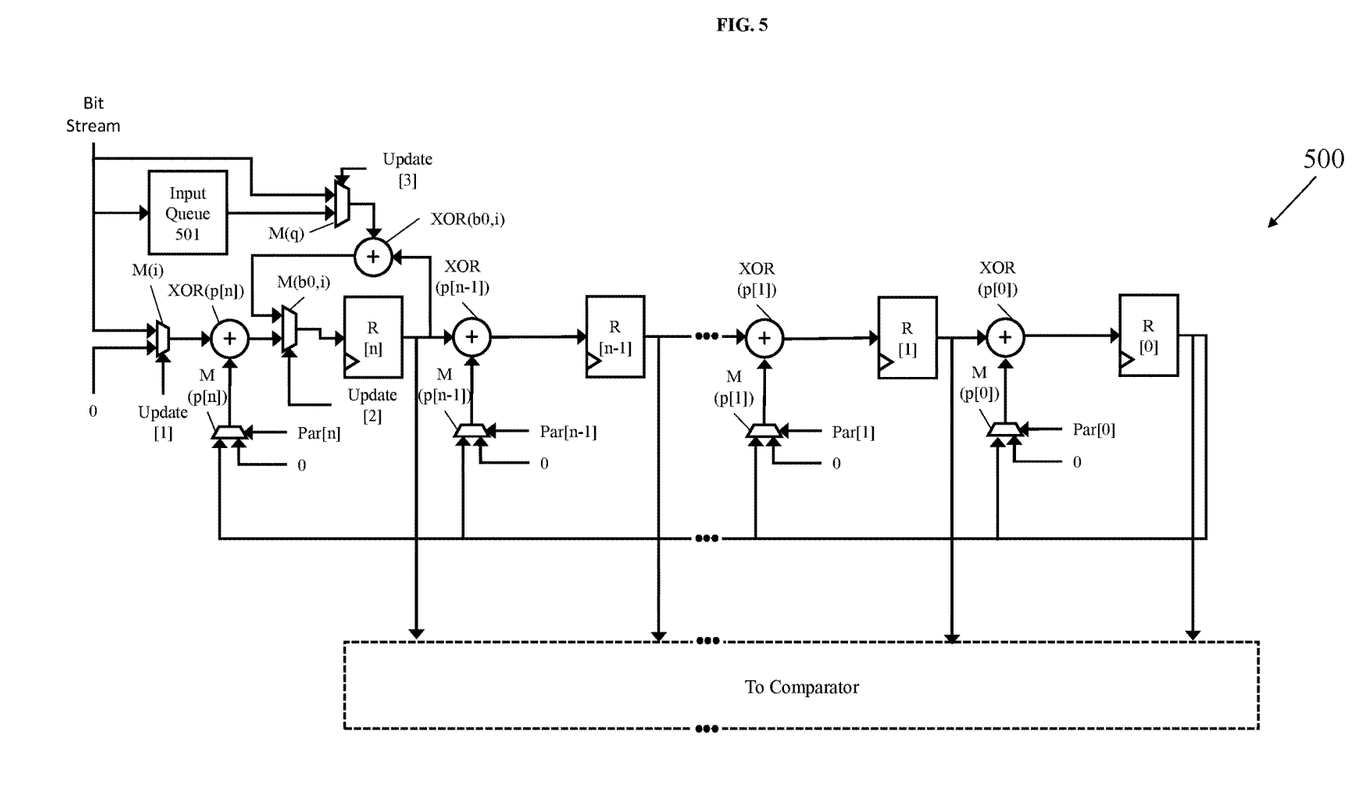
FIG. 5 illustrates an example implementation of a linear feedback shift register (LFSR) according to some embodiments of the invention.
Figure 8:
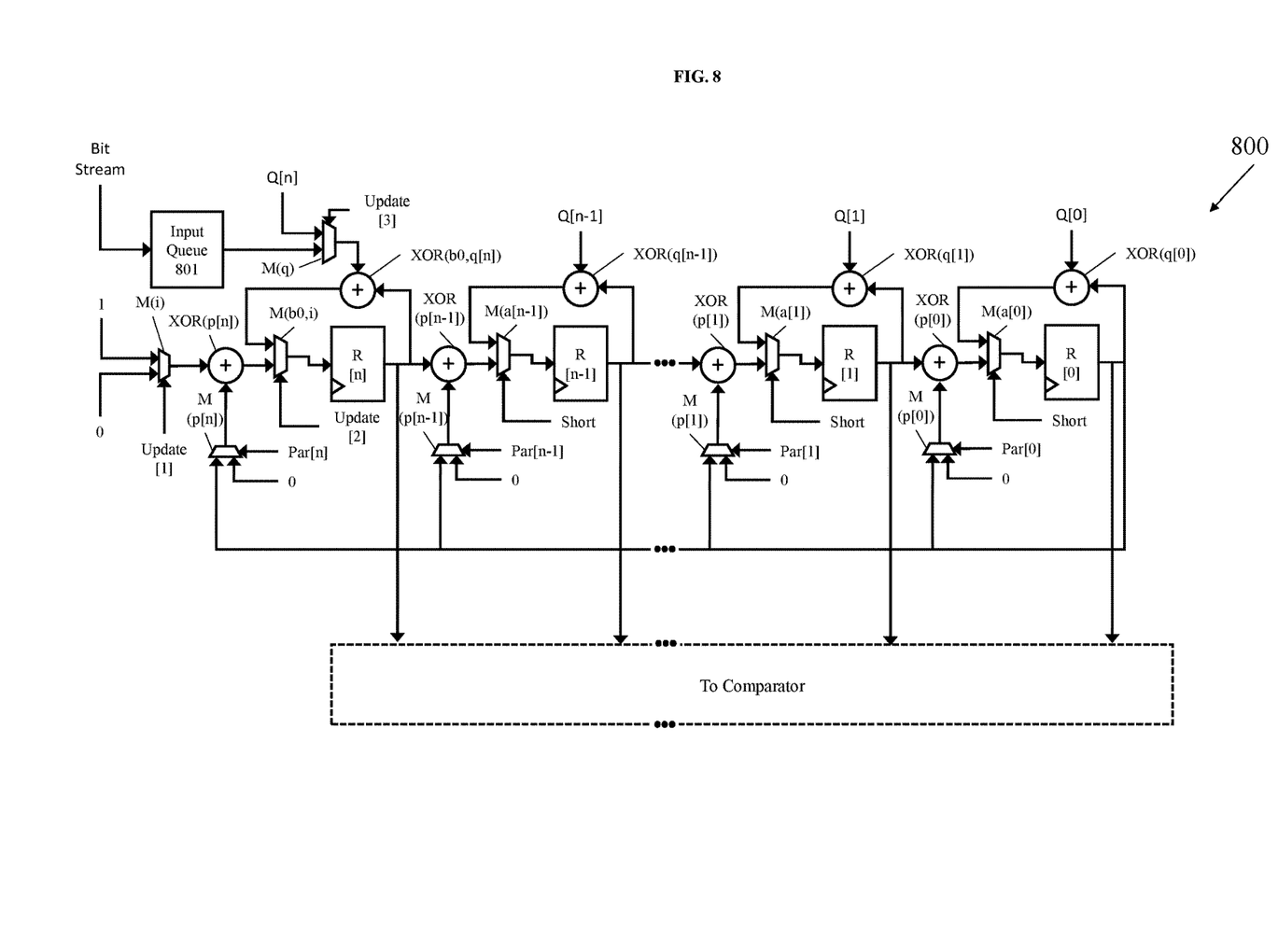
FIG. 8 illustrates an example implementation of a linear feedback shift register (LFSR) that supports shortened cyclic codes for a bit stream according to some embodiments of the invention.

The LFSR 204 could be implemented in hardware, software, or some combination thereof. The LFSR is configured to receive the target parity 202 and a bit stream. The LFSR is also configured to interface with the comparator 208. The LFSR 204 computes the parity of the incoming bit stream, transmits that calculated parity to a comparator 208. When the calculated parity is equal to the target parity 202 the bit stream window corresponds to the proper boundary of the bit stream window. Once the boundary of the bit stream window is identified then the data itself can be descramble. FIGS. 5 and 8 illustrate example implementations of the LFSR 204.

Comparator 208 receives the target parity 202 and the calculated parity from the LFSR 204. The comparator then compares the calculated parity with the target parity 202 to determine if they are equal (match). If the calculated parity and the target parity 202 are a match, then the comparator 208 sends a signal to the LFSR 204 to output the data corresponding to the bit stream window for the calculated parity. For instance, the comparator signal could be used to output the input from a buffer in the LFSR 204 for descrambling.

Figure 3:
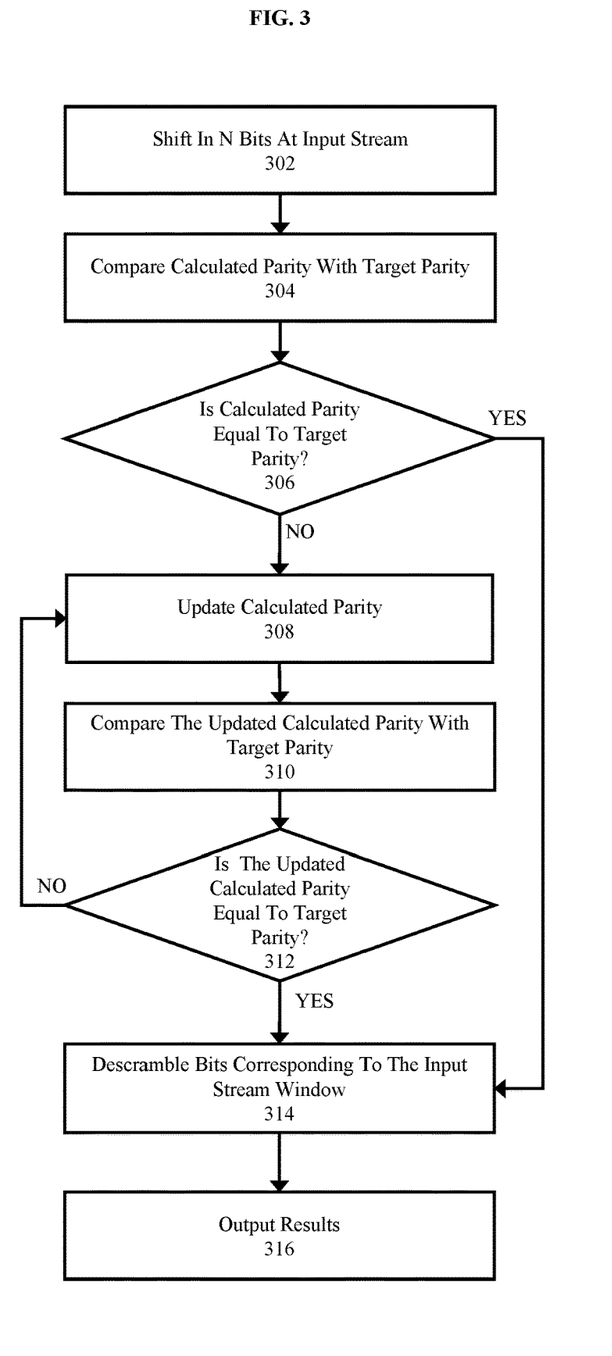
FIG. 3 illustrates a process flow for identifying the bit stream boundary according to some embodiments of the invention.

FIG. 3 illustrates a process flow for identifying the bit stream boundary according to some embodiments of the invention. The process generally includes shifting in N bits at an input stream corresponding to a bit stream input window and determining if the input window properly corresponds to a bit stream input window by comparing a target parity to a calculated parity, and if the two parity values are not a match, updating the parity computation for one input bit to compute the parity for the next bit stream input window.

At 302, the number of bits (N) corresponding to bit stream window are shifted in. For instance, in an implementation using an LFSR circuit, if N=32, then the circuit would shift in bits b[0] through b[31] into the LFSR circuit. Furthermore, as will be discussed in more detail in regard to FIGS. 5 and 8, along with each shift operation, a bitwise XOR operation will be performed as determined by the scrambling polynomial. As is known, such circuits implement polynomials used in cyclic codes for scrambling and descrambling data, such as $g(x)=x^8+x^4+x^3+x^2+1$.

At 304, the parity value calculated above is compared to the target parity. As is well known, various techniques exist for comparing values, such as via one or more instructions, dedicated hardware, or some combination thereof. If the calculated value is equal to the target parity the process continues, at 314 where the bits that correspond to the input stream window are descrambled, otherwise the process continues at 308 where the calculated parity is updated for the next bit stream input window.

At 308, the calculated parity is updated to account for the next input bit from the bit stream. This is in contrast to prior techniques. In prior techniques, when the calculated parity was determined to be unequal to the target parity the existing parity calculation was discarded and the process was restarted for the new bit stream window. These prior techniques have a multiplicative effect on the number of cycles required to complete the analysis corresponding to the number of bits in the bit stream input window, requiring at least a number of operations equal to the number of bits in the bit stream window. Further details of the update calculated parity process are discussed below in at least FIG. 4.

After the calculated parity is updated at 308, the process continues at 310 and 312 where, as in steps 304 and 306 respectively, the calculated parity is compared to the target parity, and routed to steps 308 or 312 depending on whether the updated parity is not equal to or equal to the target parity.

When either the calculated parity or the updated calculated parity is determined to be equal to the target parity at 306 or 312 respectively, the appropriate bit stream data can be descrambled at 314. Specifically, when at 306 or 312, it is determined that either of the parity values (the calculated parity or the updated calculated parity) are equal to the target parity, the bits corresponding to the bit stream window are properly aligned to the boundary and can be descrambled. After which, the results of the descrambling operation can be output or stored as necessary at 316.

Figure 4:
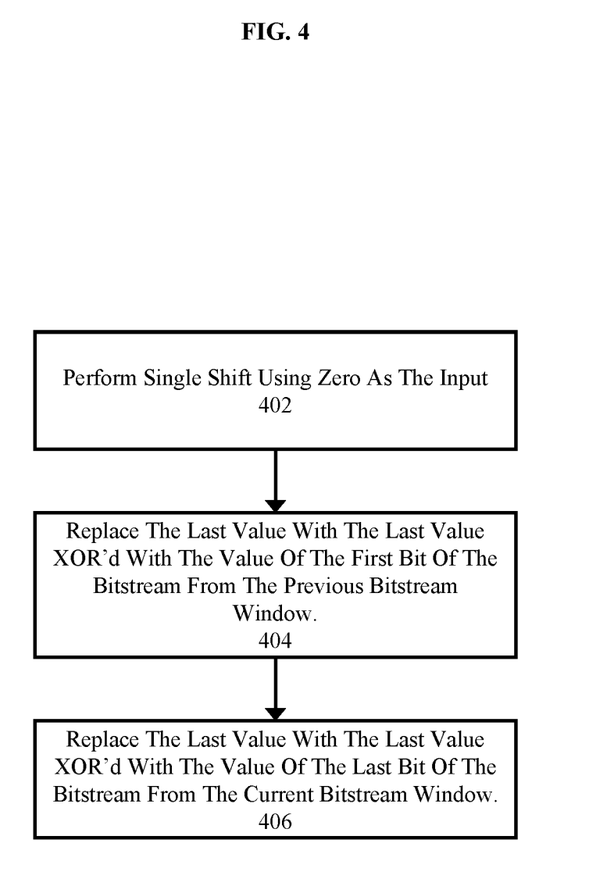
FIG. 4 illustrates an expansion of the update calculated parity block illustrated in FIG. 3 according to some embodiments of the invention.

FIG. 4 illustrates an expansion of the update calculated parity step 308 illustrated in FIG. 3 according to some embodiments of the invention. The process includes performing a single shift using zero as the input at 402, replacing the last value with the last value XOR'd with the value of the first bit of the bit stream from the previous bit stream window, and then replacing the last value with the last value XOR'd with the value of the last bit of the bit stream from the current/new bit stream window.

At 402 a first shift is performed using zero as the input. This shifts the calculated parity into the correct position to be updated with the incoming (last) bit from the current bit stream. Furthermore, as the first shift is performed each preceding bit is XOR'd with the last bit of the calculated parity, where a corresponding parity coefficient value indicates that the scrambling polynomial coefficient is not equal to zero. For example, in an implementation utilizing an LFSR, before the output of each respective register is written to the next respective register, the output is XOR'd with the output of the last register R[0] or zero as determined by the scrambling polynomial coefficients. This is performed in a way such that each successive register receives either the output of the previous register or the output of the previous register XOR'd with the output of register R[0] when the parity coefficient value indicates that the corresponding bit of the scrambling polynomial (target parity) is non zero.

After the single shift is performed the last value is again updated at 404 where, the last value of the calculated parity is replaced with the last value XOR'd with the value of the first bit of the bit stream from the previous bit stream window without performing a shift operation. This adjusts the calculated parity to remove the effects of the first bit on the previous bit stream window. The first bit of the previous bit stream window may be stored in a queue or buffer or other storage mechanism, whether shared between circuit elements or dedicated. In the alternative, such values might be stored in a software structure in temporary or persistent storage as part of a software implementation or combination of hardware and software implementations. For instance, in an LFSR implementation as disclosed in FIG. 5 R[n] is replaced with R[n] XOR'd with the first bit of the previous bit stream window without performing a shift operation.

At 406, the last value is updated a final time. This adjusts the calculated parity to add the effects of the last bit of the new bit stream window. Specifically, the last value is replaced with the last value XOR'd with the value of the last bit of the bit stream from the current bit stream window, without performing a shift operation and after the update step is performed at 404. For instance, in an LFSR implementation as disclosed in FIG. 5 R[n] is replaced with R[n] XOR'd with the last bit of the new bit stream window without performing a shift operation.

FIG. 5 illustrates an example implementation 500 of a linear feedback shift register (LFSR) according to some embodiments of the invention. The implementation includes an input queue 501 for storing bit stream inputs, a plurality of registers R[0] through R[n], a plurality of XOR circuits XOR(p[0]) through XOR(p[n]) and XOR(b0,i), and a plurality of multiplexors M(p[0]) through M(p[n]), M(i), M(b0, i), and M(q).

Registers R[0]-R[n−1] have an input that is electrically coupled to the output of a corresponding respective XOR circuit (e.g. R[0] has an input that is electrically coupled to the output of XOR(p[0])). Registers R[1]-R[n] have an output electrically coupled to the input of a corresponding next XOR circuit (e.g. R[1] has an output that is electrically coupled to the input of XOR(p[0])). The output of register R[0] is coupled to the input of multiplexors M(p[0]) through M(p[n]). The input of Register R[n] is electrically coupled to the output of multiplexor M(b0,i). Finally, the outputs of registers R[0] through R[n] are electrically coupled to a comparator.

XOR(p[0]) through XOR(p[n−1]) have a first input coupled to the output of the preceding register, a second input coupled to the output of a respective multiplexor, and an output coupled to a respective register. For instance, XOR(p[0]) has as a first input electrically coupled to the output of R[1], a second input electrically coupled to the output of multiplexer M(p[0]), and an output electrically coupled to the input of register R[0]. XOR(p[n]) has a first input coupled to the output of multiplexer M(i), a second input coupled to the output of a respective multiplexer (M(p[n])), and on output coupled to multiplexer M(b0,i). XOR(b0,i) has a first input coupled to the output of register R[n], a second input coupled to the output of a multiplexer (M(q)), and on output coupled to multiplexer M(b0,i).

Multiplexers M(p[n]) through M(p[0]) have a first input coupled to the output of register R[0], and a second input connected to the value zero/ground, an output coupled to a respective XOR circuit, and a control signal input electrically coupled to a respective bit of an expected parity value. For instance, M(p[1]) has a first input electrically coupled to the output of R[0], a second input electrically coupled to zero, an output electrically coupled to the input of XOR(p [1]), and a control signal input electrically coupled to Par[1].

Multiplexer M(i) has a first input electrically coupled to the bit stream, a second input electrically coupled to the value zero/ground, an output electrically coupled to the first input of XOR(p[n]), and a control signal input electrically coupled to a respective control signal labeled Update[1]. Multiplexer M(b0,i) has a first input electrically coupled to the output of XOR(p[n]), a second input electrically coupled to the output of XOR(b0,i), an output electrically coupled to the input of register R(n), and a control signal input electrically coupled to a respective control signal labeled Update[2]. Multiplexer M(q) has a first input electrically coupled to the bit stream, a second input electrically coupled to the first bit from input queue 501, an output electrically coupled to the first input of multiplexer M(b0,i), and a control signal input electrically coupled to a respective control signal labeled Update[3].

The input queue 501 has an input that is electrically coupled to the bit stream, and an output that is electrically coupled to the multiplexer M(q). The queue stores the input bits received at the bit stream input. The queue should preferably have the size of n+1 in order to facilitate the calculation of the parity of the bit stream, but also to provide temporary storage for the outgoing bit during the update process as will be discussed below.

The operation of implementation 500 is illustrated by way of example in the following paragraphs.

In an initial step which corresponds to 302 illustrated in FIG. 3, n bits are shifted into the LFSR from the input stream. Each bit from the bit stream is input through M(i), XOR(p[n]), and M(b0,i). Furthermore, as each bit is shifted in and during each shift operation the output of each register is XOR'd with either R[0] or the value zero depending on whether the respective parity coefficient value Par[0]-Par[n] is one or zero respectively, such that each successive register receives the value of the previous register XOR'd with either R[0] or the value zero. In this way, the input bits are shifted in and an initial parity is calculated.

After the initial n bits are shifted in, the output of the registers R[0]-R[n] are output to a comparator. The comparator determines if the calculated parity is the same as the target parity. This step corresponds to comparing the calculated parity with the target parity at 304 of FIG. 3. If the calculated parity and the target parity are the same, the bit stream window is properly aligned to a boundary and the circuit outputs the original values received for the bit stream window from the input queue 501.

If the calculated parity and the target party are not the same then the calculated parity needs to be updated to determine the updated calculated parity of the next bit stream window which corresponds to the bit stream window shift by one position. This is performed in three steps.

First, a shift operation as discussed above is performed used the value zero as the input at M(i) by selecting the zero input using the Update[1] input, and a bitwise XOR operation performed as determined by the parity coefficient values as each bit is shifted by one position. This corresponds to the performance of a single shift using zero as the input at 402 from FIG. 4.

Second, R[n] is replaced with the output of R[n] XOR'd with the first bit of the previous bit stream window, by selecting the output of XOR(b0,i) as the input for R[n] at XOR(b0,i) using the Update[2] signal, and by selecting the output of the input queue 501 as the output of M(q) using the Update[3] signal. This corresponds to replacing the last value with the last value XOR'd with the value of the first bit of the bit stream window from the previous bit stream window at 404 from FIG. 4.

Finally, R[n] is replaced with the output of R[n] XOR'd with the last bit of the new bit stream window for the bit stream, by selecting the output of XOR(b0,i) as the input for R[n] at XOR(b0,i) using the Update[2] signal, and by selecting the bit stream as the output of M(q) using the Update[3] signal. This corresponds to replacing the last value with the last value XOR'd with the value of the last bit of the bit stream window from the new bit stream window at 406 from FIG. 4.

After the parity calculation is updated for the new bit from the bit stream, the output of the registers R[0]-R[n] are output to a comparator, which determines if the updated calculate parity is the same as the expected or target parity. This corresponds to comparing the updated calculated parity with the target parity at 310 of FIG. 3. If the updated calculated parity and the target parity are the same then the circuit outputs the original values received from the bit stream using the input queue 501.

If the calculated parity and the target party are not the same, then the calculated parity needs to be updated again as described above.

Figure 6:
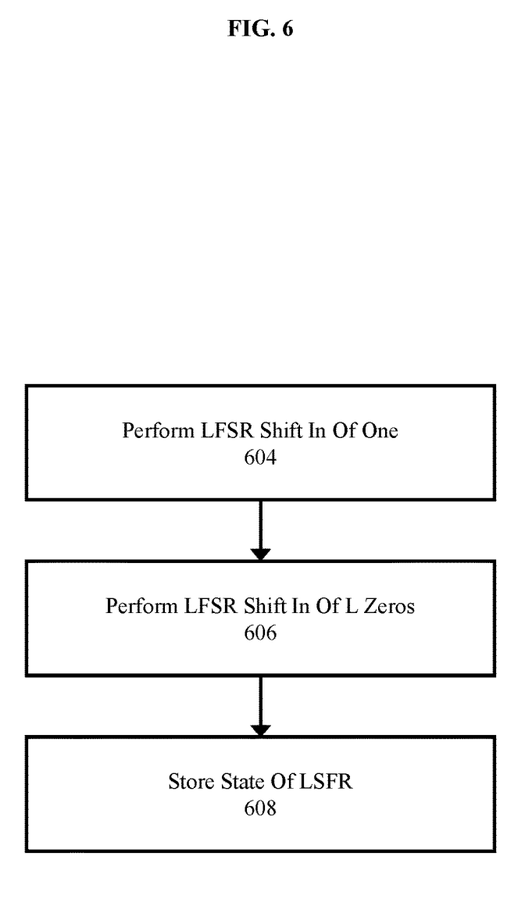
FIG. 6 illustrates a process flow for determining an offset for the parity calculation for use on a shortened cyclic code for a bit stream according to some embodiments of the invention.

FIG. 6 illustrates a process flow for determining an offset for the parity calculation for use on a shortened cyclic code for a bit stream according to some embodiments of the invention. The process will be described in the context of an LFSR circuit. However, the process could be implemented using software, hardware, or some combination thereof. This process generates the value of the computed parity to be used as an offset when calculating a corresponding shortened cyclic code as will be discussed below in regard to FIG. 7. The process generally includes shifting in the value one followed by L shifts using zero as the input, and finally storing the state of the LFSR. This process can be performed either using the circuit illustrated in FIG. 8, or by using software or some combination of software and hardware.

First, at 604 the value 1 is shifted into the first position of the LFSR circuit. Then, at 606 L zeros are shifted into the LFSR where L equals the number of bits by which the cyclic code is shorted. Furthermore, along with each shift operation, a bitwise XOR operation will be performed as determined by the parity coefficient values. Specifically, if the parity coefficient value at a given position is 1 then the value at the next position will be replaced with the previous value XOR'd with the value in the last position, and if the parity coefficient value at a given position is 0 the value at that position will be replaced with the previous value. Finally, the value held in the LFSR is stored in Q at 608, which could be in temporary memory, persistent memory, dedicated hardware or some combination thereof.

Figure 7:
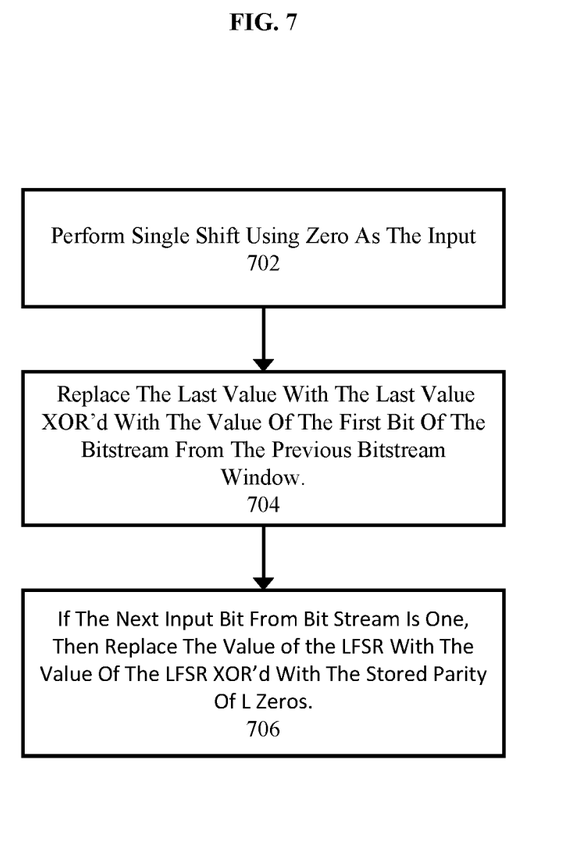
FIG. 7 illustrates an expansion of the update parity step illustrated in FIG. 3 for shortened cyclic codes for a bit stream according to some embodiments of the invention.

FIG. 7 illustrates an expansion of the update parity step illustrated in FIG. 3 for shortened cyclic code for a bit stream according to some embodiments of the invention. The process largely mirrors the process discussed with regard to FIG. 4 above with some adjustments.

First, the process starts once the parity offset is calculated as illustrated in regard to FIG. 6. The initial parity value is reset to 0. Parity adjustment for input bits of the first window can then be performed in a two step process. This is performed by first shifting in zero for the next input bit of the bit stream window and calculating parity by performing XOR operations as per parity coefficient values. Second if the next input bit of the bit stream window is equal to one then a bitwise XOR operation is performed on the current calculated parity value such that the current value is replaced with the current value XOR'd with Q, the stored parity offset.

For example, if the parity is being calculated using an LFSR circuit, when the last input bit was a one then an XOR operation is performed using the previously computed offset Q, and the registers R[0] through R[n] are updated such that R(x)=R(x) XOR Q(x) for each respective register and corresponding Q. Finally, this process is repeated for each remaining bit (in this example bits 1-23) until all the inputs for the bit stream window are adjusted for. At which point, the process continues at 304 of FIG. 3, where the calculated parity is compared with the target parity. However, if, at 306 of FIG. 3, it is determined that the calculated parity is not equal to the target parity then the process continues with the update process of FIG. 7 illustrated below.

In order to update the calculated parity at 702, a single shift is performed using zero as the input as discussed above in regard to 402 which includes performing any appropriate XOR operations where the parity coefficient value is 1.

Similar to 404, at 704 the last value of the calculated parity is replaced with the last value of the calculated parity XOR'd with the first bit of the previous bit stream window. For instance, FIG. 8 illustrates a circuit for calculating parity using an LFSR wherein the register R[n] corresponds to the last value, and to the least significant bit.

Finally, at 706 if the next input bit is equal to 1 then the calculated parity is replaced with the bitwise XOR of the calculated parity with the value Q previously computed without performing a shift operation. For instance, in an LFSR implementation, the values of the registers R[n] through R[0] are replaced with R[x] XOR'd with the corresponding Q[x], such that R[x]=R[x] XOR Q[x] for each register. At which point, the process continues at 310 of FIG. 3, where the calculated parity is compared with the target parity. If, at 312 of FIG. 3, it is determined that the updated calculated parity is not equal to the target parity then the process continues with the modified update process of FIG. 7 for each respective input bit from the bit stream.

FIG. 8 illustrates an example implementation 800 of a linear feedback shift register (LFSR) that supports shortened cyclic codes for a bit stream according to some embodiments of the invention. The circuit and operation thereof is largely similar to the circuit discussed in FIG. 5 excluding the differences discussed below which provide support for shortened cyclic codes and for calculating the offset Q.

A first difference between implementation 800 and implementation 500 is the inclusion of additional XOR feedback loops. Specifically, XOR(q[0]) through XOR(q[n−1]) are added to the circuit with a first input electrically coupled to the output of one of the respective registers R[0] through R[n−1], a second input electrically coupled to a corresponding one of Q[0] through Q[n−1] and an output coupled to a respective multiplexer M(a[0]) through M(a[n−1]) which select between the output of a respective XOR circuit of XOR(p[0]) through XOR(p[n−1]) as determined by the control signal labeled Short. For instance, XOR(q[1]) has a first input electrically coupled to the output of R[1], a second input electrically coupled to Q[1], an output electrically coupled to the input of a multiplexer M(a[1]).

XOR(b0,i) has been relabeled as XOR(b0,q[n]) to reflect the fact that XOR(b0,q[n]) can now receive Q(n) at its input, as determined by multiplexer M(q). M(q) has itself been modified to support selection between the inputs; Q[n] and the output of input queue 801, but is otherwise equivalent to the multiplexer XOR(b0,i) of FIG. 5.

The multiplexer M(i) has also been modified to support the selection of either a 0 or a 1.

The input queue 801 is essentially the same as input queue 501, and is as described therein.

The operation of implementation 800 is illustrated by way of example in the following paragraphs.

In an initial series of steps which correspond to the process illustrated in FIG. 6, an offset for the parity calculation is determined. First, at 604 the value 1 is shifted into the first position of the LFSR circuit. Then, at 606 L zeros are shifted into the LFSR where L equals the number of bits by which the cyclic code is shorted. Furthermore, during each shift operation the value in the preceding register is XOR'd with either the value in R[0] or the value 0 depending on whether the corresponding parity coefficient value is either a zero or a one respectively as discussed above in regard to FIG. 5. The result is then stored in another storage location Q which corresponds to 608, such that Q holds the values of the registers R[0] through R[n], which is the calculated parity offset of the shortened segment of the input.

In addition to the calculation of the parity offset value discussed above, the inputs from the bit stream for shortened cyclic codes are shifted into the parity circuit in a different process then that of the LFSR discussed in FIG. 5 and corresponding to 304 of FIG. 3. Here, to calculate the initial parity value of the shortened cyclic code corresponding to 304 of FIG. 3, an additional step is performed to those disclosed in regard to FIGS. 3 and 5. Specifically, for every new input bit, first a 0 is shifted as input into the LFSR and a bitwise XOR operation is performed as per parity value coefficients. Then, a determination is made if the input bit is 1. If the input bit is a 1, then a bitwise XOR operation is required to adjust the LFSR. This is accomplished by performing a bitwise XOR on the value stored in the LFSR with the stored offset Q, and then storing the value back into the LFSR. In the provided illustration, the XOR circuits XOR(q[0]) through XOR(q[n−1]) and XOR(b0,q[n]) receive a first input from the output of the respective register R[0] through R[n], and a second input from the stored offset Q[0] through Q[n], and the output of these XOR circuits are route to the inputs of the respective registers R[0] through R[n] via the multiplexers M(a[0]) through M(a[n−1]) and M(b0,i) using the control signals Short and Update[2]. Finally, the registers R[0] through R[n] latch the output of the XOR circuits into the registers. In this way the input bits are shifted in and an initial parity is calculated.

After the initial input bits are shifted in, the output of the registers R[0]-R[n] are output to a comparator. The comparator determines if the calculated parity is the same as the expected or target parity. This step corresponds to comparing the calculated parity with the target parity at 304 of FIG. 3. If the calculated parity and the target parity are the same the bit stream window is properly aligned to a boundary, then the circuit outputs the original values received for the bit stream window from the input queue 801.

If the calculated parity and the target party are not the same, then the calculated parity needs to be updated to determine the parity of the next bit stream window, which corresponds to the bit stream window being shift one position over. This is performed in three steps.

First, a shift operation as discussed above is performed used the value zero as the input at M(i) by selecting the zero input using the Update[1] input, and a bitwise XOR operation will be performed as determined by parity coefficient values as each bit is shifted by one position. This corresponds to the performance of a single shift using zero as the input at 702 from FIG. 7 and is essentially the same as described for 402 from FIG. 4.

Second, R[n] is replaced with the output of R[n] XOR'd with the first bit of the previous bit stream window by selecting the output of XOR(b0,q[n]) as the input for R[n] at XOR(b0,q[n]) using the Update[2] signal and by selecting as the output the bit in the last position (b0) of the input queue 801 as the output and using M(q) and the Update[3] signal. This corresponds to replacing the last value with the last value XOR'd with the value of the first bit of the bit stream window of the shortened cyclic code from the previous bit stream window at 704 from FIG. 7.

Finally, if the last bit of the new bit stream window is equal to 1 then a bitwise XOR operation is required to adjust the LFSR. This is accomplished by performing a bitwise XOR on the value stored in the LFSR with the stored offset Q, and then storing the value back into the LFSR. In the provided illustration, the XOR circuits XOR(q[0]) through XOR(q[n−1]) and XOR(b0,q[n]) receive a first input from the output of the respective register R[0] through R[n], and a second input from the stored offset Q[0] through Q[n], and the output of these XOR circuits are route to the inputs of the respective registers R[0] through R[n] via the multiplexers M(a[0]) through M(a[n−1]) and M(b0,i) using the control signals Short and Update[2]. Finally, the registers R[0] through R[n] latch the output of the XOR circuits into the registers. In this way, the calculated parity is updated corresponding to 706 from FIG. 7.

After the parity calculation is updated for the new bit from the bit stream, the output of the registers R[0]-R[n] are output to a comparator, which determines if the calculate parity is the same as the expected or target parity. This step corresponds to compare the updated calculated parity with the target parity at 310 of FIG. 3. If the updated calculated parity and the target parity are the same then the circuit outputs the original values received from the bit stream from the input queue 801.

If the calculated parity and the target party are not the same, then the calculated parity needs to be updated again as described above.

System Architecture Overview

Figure 9:
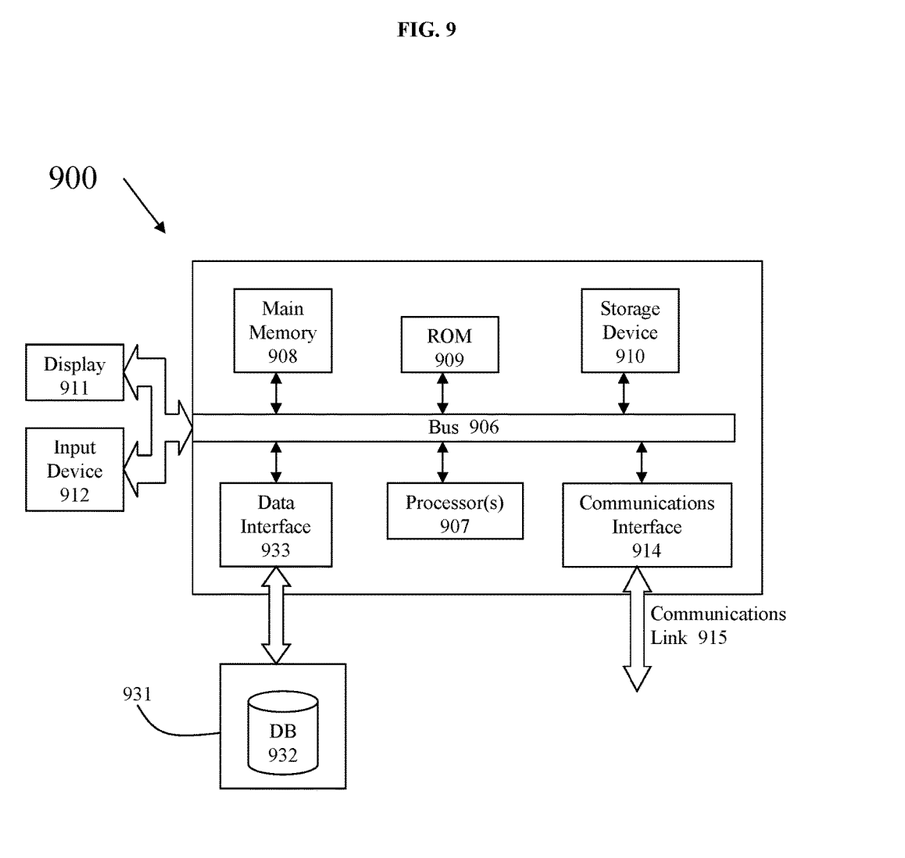
FIG. 9 depicts a computerized system on which some embodiments of the invention can be implemented.

FIG. 9 is a block diagram of an illustrative computing system 900 suitable for implementing an embodiment of the present invention. For instance, computing system 900 could include dedicated hardware similar to the hardware illustrated in the previous figures. Furthermore, the computing system 900 could include software to implement the elements of the process describe, or the computing system 900 could include both hardware and software that together implements the disclosed process. Computer system 900 includes a bus 906 or other communication mechanism for communicating information, which interconnects subsystems and devices, such as processor 907, system memory 908 (e.g., RAM), static storage device 909 (e.g., ROM), disk drive 910 (e.g., magnetic or optical), communication interface 914 (e.g., modem or Ethernet card), display 911 (e.g., CRT or LCD), input device 912 (e.g., keyboard), and cursor control.

According to one embodiment of the invention, computer system 900 performs specific operations by processor 907 executing one or more sequences of one or more instructions contained in system memory 908. Such instructions may be read into system memory 908 from another computer readable/usable medium, such as static storage device 909 or disk drive 910. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 907 for execution. Such a medium may take many forms, including but not limited to, non-volatile media and volatile media. Non-volatile media includes, for example, optical or magnetic disks, such as disk drive 910. Volatile media includes dynamic memory, such as system memory 908.

Common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 900. According to other embodiments of the invention, two or more computer systems 900 coupled by communication link 915 (e.g., LAN, PTSN, or wireless network) may perform the sequence of instructions required to practice the invention in coordination with one another.

Computer system 900 may transmit and receive messages, data, and instructions, including program, e.g., application code, through communication link 915 and communication interface 914. Received program code may be executed by processor 907 as it is received, and/or stored in disk drive 910, or other non-volatile storage for later execution. Computer system 900 may communicate through a data interface 933 to a database 932 on an external storage device 931.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. An apparatus, comprising:
a plurality of linear feedback shift registers electrically coupled to receive a bit stream input, a target parity comprising coefficients corresponding to a generator polynomial, and electrically coupled to transmit a plurality of values representing a generated initial calculated parity of a first bit stream window of an input stream,
a comparator electrically coupled to the plurality of linear feedback shift registers that determines whether the initial calculated parity is equal to a target parity, and
a descrambler that descrambles the first bit stream window corresponding to the initial calculated parity when the comparator determines that the initial calculated parity is equal to the target parity, wherein the plurality of linear feedback shift registers are configured to update the initial calculated parity by generating an updated calculated parity for a second bit stream window when the initial calculated parity is not equal to the target parity, the comparator is further configured to determine if the updated calculated parity is equal to the target parity, and the descrambler is configured to descramble the second bit stream window when the updated calculated parity is equal to the target parity.

2. The apparatus of claim 1, wherein updating the initial calculated parity comprises:
performing a single shift operation on the plurality of the linear feedback shift registers using zero as an input to a last linear feedback shift register to generate a shifted calculated parity, and
performing an XOR operation using a value of the last linear feedback shift register, a first bit of a previous bit stream window, and a last bit of a new bit stream window.

3. The apparatus of claim 2, wherein performing the single shift operation further comprises performing an XOR operation on at least one of the respective bits of the linear feedback shift registers in the plurality of linear shift feedback registers as determined by a corresponding coefficient for a representative polynomial of a cyclic code.

4. The apparatus of claim 1, wherein generating the initial calculated parity of a first bit stream window of an input stream comprises performing an XOR operation on at least one respective value of the linear feedback shift registers in the plurality of linear shift feedback registers as determined by a corresponding coefficient for a representative polynomial of a cyclic code each time a bit of the input stream is shifted in.

5. The apparatus of claim 1, wherein the plurality of linear feedback shift registers are configured to support shortened cyclic codes.

6. The apparatus of claim 5, wherein the plurality of linear feedback shift registers are reset to zero.

7. The apparatus of claim 6, wherein a parity offset is computed using the plurality of linear feedback shift registers by shifting in a one followed by L zeros, where L is equal to a number bits of a cyclic code minus a number of bits of the shortened cyclic code.

8. The apparatus of claim 6, wherein a zero is shifted into the plurality of linear feedback shift registers for each respective bit of the input stream and a corresponding bitwise XOR operation is performed when the respective bit is equal to one by replacing a value of the plurality of linear feedback shift registers with the value of the plurality of linear feedback shift registers XOR'd with the parity offset.

9. The apparatus of claim 8, wherein the target parity represents a shortened cyclic code and updating the initial calculated parity comprises:
performing a single shift operation of the plurality of the linear feedback shift registers using zero as an input to a last linear feedback shift register to generate a shifted calculated parity,
performing an XOR operation using a value of a last linear feedback shift register and a first bit of a previous bit stream window, and
performing a bitwise XOR operation when the respective input bit is equal to one by replacing the respective bits of the plurality of linear feedback shift registers with the value of the plurality of linear feedback shift registers XOR'd with the parity offset.

10. A method for identifying a boundary of a scrambled bit stream, comprising:
generating, by a plurality of linear feedback shift registers, an initial calculated parity of a first bit stream window of an input stream, determining if the initial calculated parity is equal to a target parity by a comparator electrically coupled to the linear feedback shift registers, descrambling, by a descrambler, the first bit stream window corresponding to the initial calculated parity when it is determined by the comparator that the initial calculated parity is equal to the target parity, updating, by the plurality of linear feedback shift registers, the initial calculated parity by generating an updated calculated parity for a second bit stream window when the initial calculated parity is not equal to the target parity, determining if the updated calculated parity is equal to the target parity by the comparator, and descrambling, by the descrambler, the second bit stream window when the updated calculated parity is equal to the target parity.

11. The method of claim 10, wherein updating the initial calculated parity comprises:

performing a single shift operation using zero as an input to generate a shifted calculated parity, and performing an XOR operation using a last value of the initial calculated parity, a first bit of a previous bit stream window, and a last bit of a new bit stream window.

12. The method of claim 11, wherein performing the single shift operation further comprises performing an XOR operation on the updated calculated parity as determined by a corresponding coefficient for a representative polynomial of a cyclic code.

13. The method of claim 10, wherein generating the initial calculated parity of a first bit stream window of an input stream comprises performing an XOR operation on at least one respective value of a plurality of values representing an interim calculated parity as determined by a corresponding coefficient for a representative polynomial of a cyclic code each time a bit of the input stream is shifted in.

14. The method of claim 10, wherein the method supports shortened cyclic codes.

15. The method of claim 14, wherein a plurality of values representing an interim calculated parity are reset to zero.

16. The method of claim 15, wherein a parity offset is computed using a plurality of linear feedback shift registers by shifting in a one followed by L zeros, where L is equal to a number bits of a cyclic code minus a number of bits of the shortened cyclic code.

17. The method of claim 15, wherein a zero is shifted into the interim calculated parity for each respective bit of the input stream and a corresponding bitwise XOR operation is performed when the respective bit is equal to one by replacing the interim calculated parity with the interim calculated parity XOR'd with the parity offset.

18. The method of claim 17, wherein the target parity represents a shortened cyclic code and updating the initial calculated parity comprises:

performing a single shift operation of the initial calculated parity using zero as an input to an initial calculated parity to generate a shifted calculated parity, performing an XOR operation using a value of the least significant big of the shifted calculated parity and a first bit of a previous bit stream window, and performing a bitwise XOR operation when a respective input bit is equal to one by replacing the shifted calculated parity with the shifted calculated parity XOR'd with the parity offset.

* * * * *